United States Patent
Hwang et al.

(10) Patent No.: US 8,587,119 B2
(45) Date of Patent: Nov. 19, 2013

(54) CONDUCTIVE FEATURE FOR SEMICONDUCTOR SUBSTRATE AND METHOD OF MANUFACTURE

(75) Inventors: Chien-Ling Hwang, Hsinchu (TW); Yi-Wen Wu, Xizhi (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 364 days.

(21) Appl. No.: 12/761,641

(22) Filed: Apr. 16, 2010

(65) Prior Publication Data

US 2011/0254159 A1   Oct. 20, 2011

(51) Int. Cl.
*H01L 23/488* (2006.01)
*H01L 21/60* (2006.01)

(52) U.S. Cl.
USPC .......... 257/737; 257/751; 257/734; 257/738; 257/760; 257/774; 257/773; 257/792; 257/E23.021; 257/E21.508; 257/E23.023

(58) Field of Classification Search
USPC .......... 257/751, 734, E23.021, 737, 738, 760, 257/774, 773, 792, 787, E21.509, E23.023, 257/E21.508; 438/613, 615, 620, 618, 622, 438/627
See application file for complete search history.

(56) References Cited

U.S. PATENT DOCUMENTS

| | | | |
|---|---|---|---|
| 6,350,668 B1 * | 2/2002 | Chakravorty | 438/612 |
| 6,593,220 B1 * | 7/2003 | Yu et al. | 438/612 |
| 6,667,230 B2 * | 12/2003 | Chen et al. | 438/613 |
| 6,958,546 B2 * | 10/2005 | Fan et al. | 257/773 |
| 7,005,752 B2 * | 2/2006 | Bojkov et al. | 257/786 |
| 7,667,335 B2 * | 2/2010 | Lin et al. | 257/779 |
| 2004/0094837 A1 * | 5/2004 | Greer | 257/737 |
| 2005/0263857 A1 * | 12/2005 | Yuasa et al. | 257/642 |
| 2008/0308932 A1 * | 12/2008 | Lii et al. | 257/738 |

FOREIGN PATENT DOCUMENTS

| | | |
|---|---|---|
| CN | 101286495 | 10/2008 |
| TW | I300616 | 9/2008 |
| TW | 200947509 | 11/2009 |
| TW | M375291 | 3/2010 |

OTHER PUBLICATIONS

Office Action from corresponding application No. CN 201010534192.6.
Office Action dated Jun. 19, 2013 from corresponding application No. TW099134680.

* cited by examiner

*Primary Examiner* — Matthew Reames
*Assistant Examiner* — Benjamin Tzu-Hung Liu
(74) *Attorney, Agent, or Firm* — Lowe Hauptman & Ham, LLP

(57) ABSTRACT

An embodiment of the disclosure includes a conductive feature on a semiconductor die. A substrate is provided. A bond pad is formed over the substrate. The bond pad has a first width. A polyimide layer is formed over the substrate and the bond pad. The polyimide layer has a first opening over the bond pad with a second width. A silicon-based protection layer overlies the polyimide layer. The silicon-based protection layer has a second opening over the bond pad with a third width. The first opening and the second opening form a combined opening having sidewalls to expose a portion of the bond pad. A UBM layer is formed over the sidewalls of combined opening to contact the exposed portion of the bond pad. A conductive feature overlies the UBM layer.

20 Claims, 8 Drawing Sheets

CONDUCTIVE FEATURE FOR SEMICONDUCTOR SUBSTRATE AND METHOD OF MANUFACTURE

TECHNICAL FIELD

The disclosure relates generally to semiconductor packaging processes, and more particularly, to a structure and methods for forming a conductive feature in a flip chip package.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the advantages in size, performance and flexibility flip chips have over other packaging methods.

However, the standard solder bump manufacture processes have a number of shortcomings. For example, the polyimide layer may be damaged during the process. Some contaminations would remain on the surface of the polyimide layer. The contaminations may reduce the adhesion of the underfill in the following process. Therefore, the failure rate of the overall assembly could increase.

Accordingly, there is a need for an improved structure and method to form conductive feature for a semiconductor wafer with robust electrical performance.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

FIGS. 1 to 8 are cross-sectional views showing various stages during fabrication a structure according to one or more embodiments of this invention. The term "substrate" as described herein, refers to a semiconductor substrate on which various layers and integrated circuit components are formed. The substrate, in some embodiments, includes silicon or compound semiconductor, such as GaAs, InP, Si/Ge, or SiC. Examples of layers include dielectric layers, doped layers, metal layers, polysilicon layers and via plugs that connect one layer to one or more layers. Examples of integrated circuit components include transistors, resistors, and/or capacitors. The substrate includes a plurality of semiconductor dies fabricated on a surface of the substrate, wherein each die comprises one or more integrated circuits. The plurality of semiconductor dies are divided by scribe lines (not shown) between the die. The following process steps will be performed on the plurality of semiconductor dies on the surface of the substrate.

Figure 1:
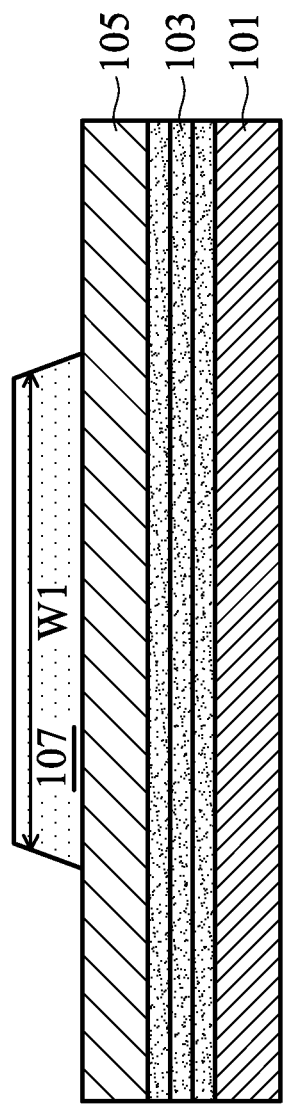
FIGS. 1 to 8 are cross-sectional views showing various stages during fabrication of a structure according to one or more embodiments.

Referring to FIG. 1, a substrate 101 with a plurality of semiconductor dies (not shown) on the surface is provided. The portion of the substrate 101 in FIG. 1 contains only a portion of one of the plurality of dies. A plurality of interconnect layers 103 are formed on the surface of the substrate 101. The interconnect layers 103 include one or more conductive layers disposed within one or more dielectric layers. The conductive layers electrically connect integrated circuit components, and provide electrical connections from the integrated circuits to the upper layers. The dielectric layer in the interconnect layers 103, in some embodiments, is formed, for example, of low-k dielectric materials with dielectric constants (k value) between about 2.9 and 3.8, ultra low-k (ULK) dielectric materials with k values between about 2.5 and about 2.9, some combination of low-k dielectric materials, or the like. Typically the lower k value a dielectric layer has, the more fragile and prone to delamination and cracking the layer becomes.

A passivation layer 105 is formed over the interconnect layers 103 to protect the integrated circuits and interconnect layers 103 from damage and contamination. The passivation layer 105, in some embodiments, includes one or more layers, such as oxide, undoped silicate glass (USG), silicon nitride (SiN), silicon dioxide ($SiO_2$) or silicon oxynitride (SiON). The passivation layer 105 prevents or decreases moisture, mechanical, and radiation damage to the integrated circuits.

Still referring to FIG. 1, a bond pad 107 is formed over the passivation layer 105. The bond pad 107 has a first width W1. The bond pad 107 contacts a conductive layer in the interconnect layers 103 and provides electrical connection to the underlying integrated circuits. In one embodiment, the bond pad 107 includes an electrically conductive material such as aluminum, aluminum alloy, copper, copper alloy, or combinations thereof. The bond pad 107 is deposited, in some embodiments, by physical vapor deposition (PVD) such as a sputtering deposition using a sputtering target made of aluminum, copper or an alloy thereof followed by patterning the deposited layer for the bond pad 107 with photolithography and etching.

Figure 2:
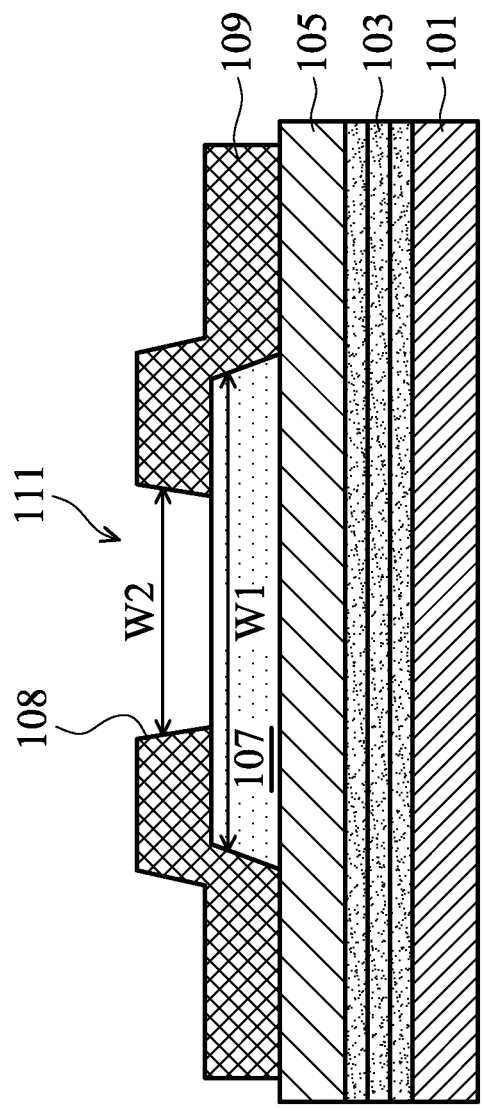

Referring to FIG. 2, a polyimide layer 109 is formed over the passivation layer 105 and the bond pad 107. The polyimide layer 109 has a thickness of between about 3 μm and about 10 μm. The polyimide layer 109 is, in some embodiments, deposited over the passivation layer 105 and the bond pad 107 by conventional deposition techniques, such as spin-on coating method. Photolithography and etching follow the deposition to selectively define an opening 111 on the bond pad 107. The polyimide layer 109 partially covers the bond pad 107 and leaves a portion of a surface of the bond pad 107 in the opening 111 exposed. The opening 111 has a second width W2 and sidewalls 108. A ratio of the second width W2 to the first width W1 (W2/W1) is between about 0.15 to about 0.6. The polyimide layer 109 serves as a stress buffer to reduce the stress transferred to the passivation layer 105 during assembly process.

Figure 3:
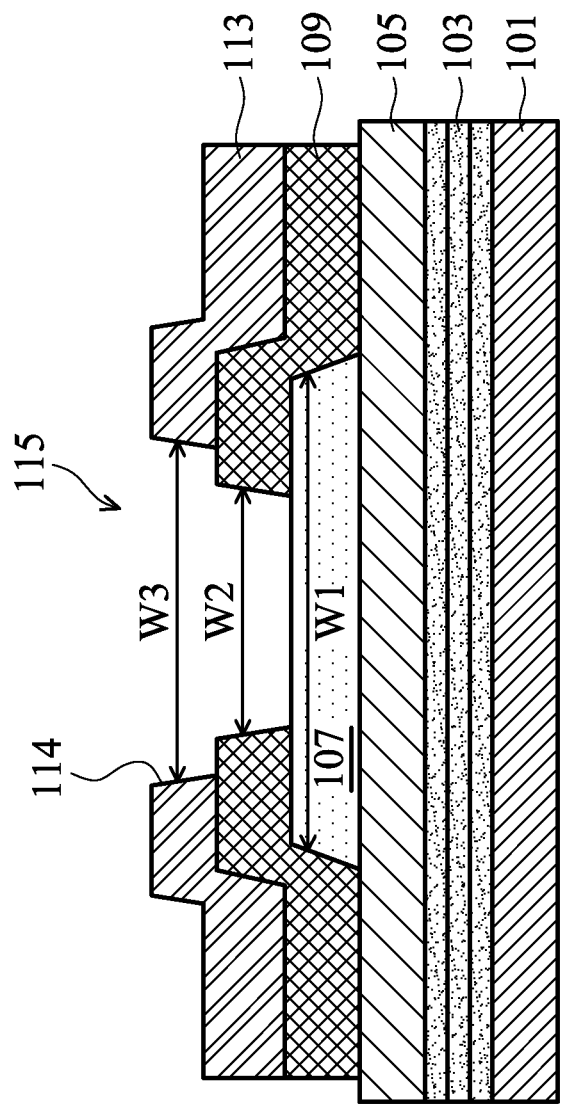

Referring to FIG. 3, a silicon-based protection layer 113 is formed over the polyimide layer 109 and the bond pad 107. The silicon-based protection layer 113 has a thickness of between about 0.035 μm and about 1.2 μm. When the silicon-based protection layer 113 is deposited (not shown), it directly overlies the polyimide layer 109 and fills into the opening 111 to cover the exposed surface of the bond pad 107. Photolithography and patterning follow to selectively define a combined opening 115 comprising the opening in the polyimide 109 of width W2 and an opening in the silicon-based protection layer 113 of width W3. The combined opening 115 exposes a portion of the bond pad 107. The combined opening 115 has sidewalls 114. A ratio of the third width W3 to the first width W1 (W3/W1) is between about 0.15 to about 0.6. The silicon-based protection layer 113 is a material containing silicon such as silicon nitride, silicon oxynitride, silicon oxide or silicon carbide. The silicon-based protection layer 113 has a higher hardness than the polyimide layer 109. The silicon-based protection layer 113 protects the polyimide layer 109 from damage in the following plasma clean process, and absorbs or releases thermal or mechanical stress during bumping process.

The yield of assembly is related to the ratios of the widths of the openings in the polyimide layer 109 (W2) and the silicon-based protection layer 113 (W3) to the width of the bond pad 107 (W1). When either ratio (W3/W1 or W2/W1) is lower than 0.15, the failure rate of assembly could rise. When either of the ratios (W3/W1 or W2/W1) is higher than 0.6, the underlying low-k dielectric layer in interconnect layer 103 could crack during assembly process.

Figure 4:
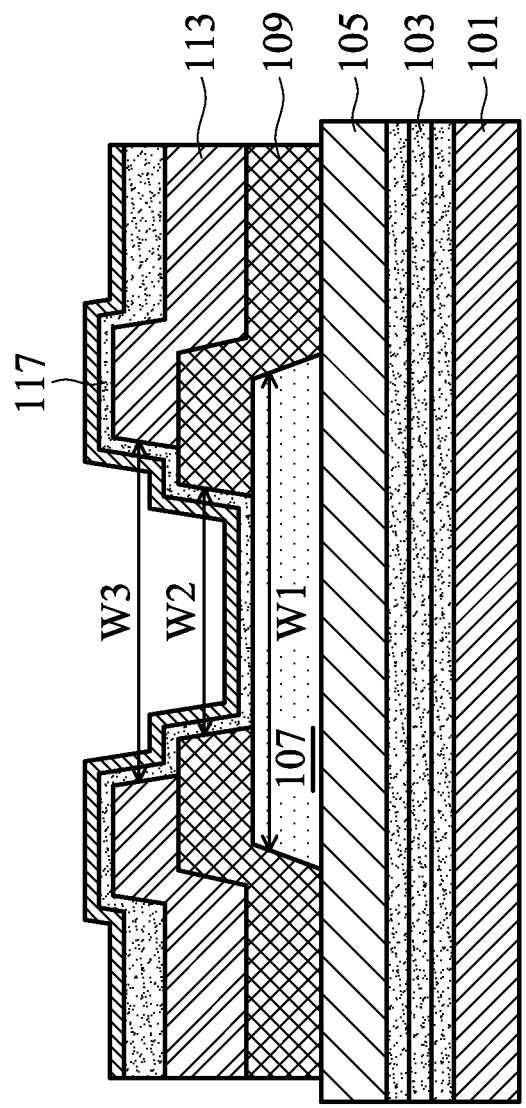

Referring to FIG. 4, an under bump metallurgy (UBM) layer 117 is formed over the silicon-based protection layer 113 and lines the sidewalls 114 of the combined opening 115 and contacts the exposed portion of the bond pad 107. The UBM layer 117, in some embodiments, includes multiple layers of conductive materials, such as a layer of titanium, a layer of copper, and a layer of nickel. Each layer in the UBM layer 117 is preferably formed using a plating process, such as electrochemical plating, although other processes of formation, such as sputtering, evaporation, electroless plating or PECVD process, may alternatively be used depending upon the desired materials.

Figure 5:
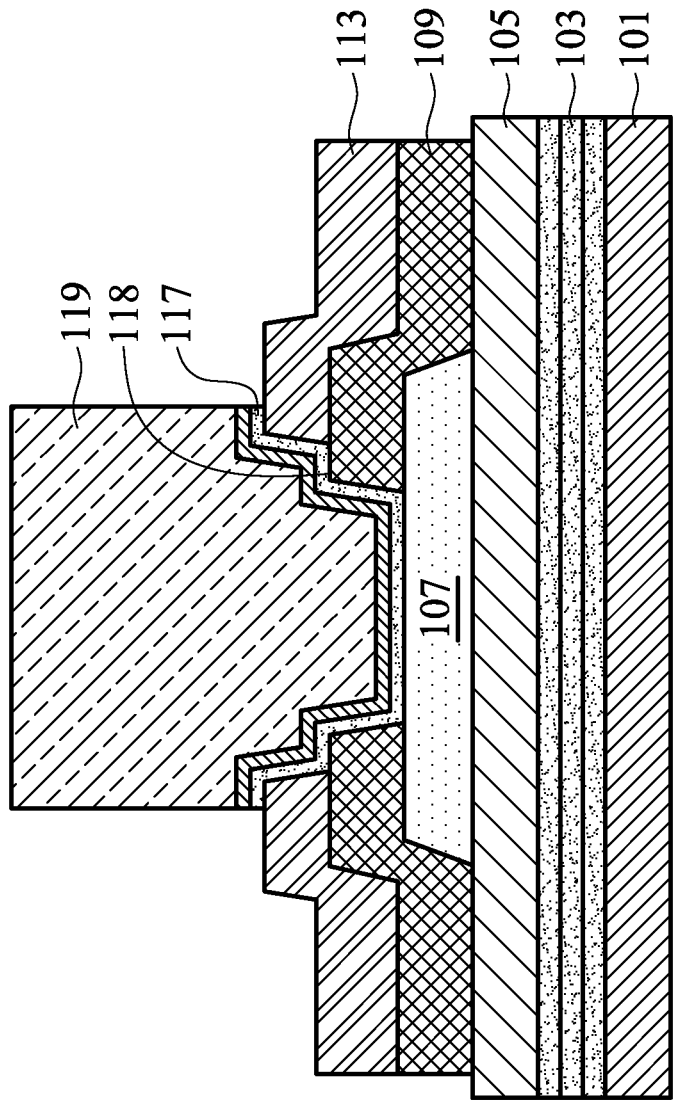

Next, a photoresist layer (not shown) is formed over the UBM layer 117 and developed to form a hole that exposes the UBM layer 117 in the combined opening 115 and over the exposed portion of the bond pad 107. The photoresist layer acts as a mold for metal deposition process for conductive feature formation. A conductive material is deposited, in some embodiments, in the hole by evaporation, electroplating, or screen printing to form a column of conductive feature 119 over the UBM layer 117 as shown in FIG. 5. The conductive material includes any of a variety of metals, metal alloys or metals and mixture of other materials and the conductive material includes solder and copper.

After the removal of the photoresist layer, the UBM layer 117 not covered by the conductive feature 119 is removed by a reactive ion etch (RIE) process that etches the exposed portions of the UBM layer 117 down to the underlying silicon-based protection layer 113. The remaining UBM layer 117 under the conductive feature 119 is disposed over the sidewalls 114 of the combined opening 115, and is also over a top portion of the silicon-based protection layer 113, and contacts the exposed portion of the bond pad 107. In one embodiment, the conductive feature 119 is a copper pillar. In another embodiment, the conductive feature 119 is a solder, wherein the solder is reflown by heating to form a solder bump.

Figure 6:
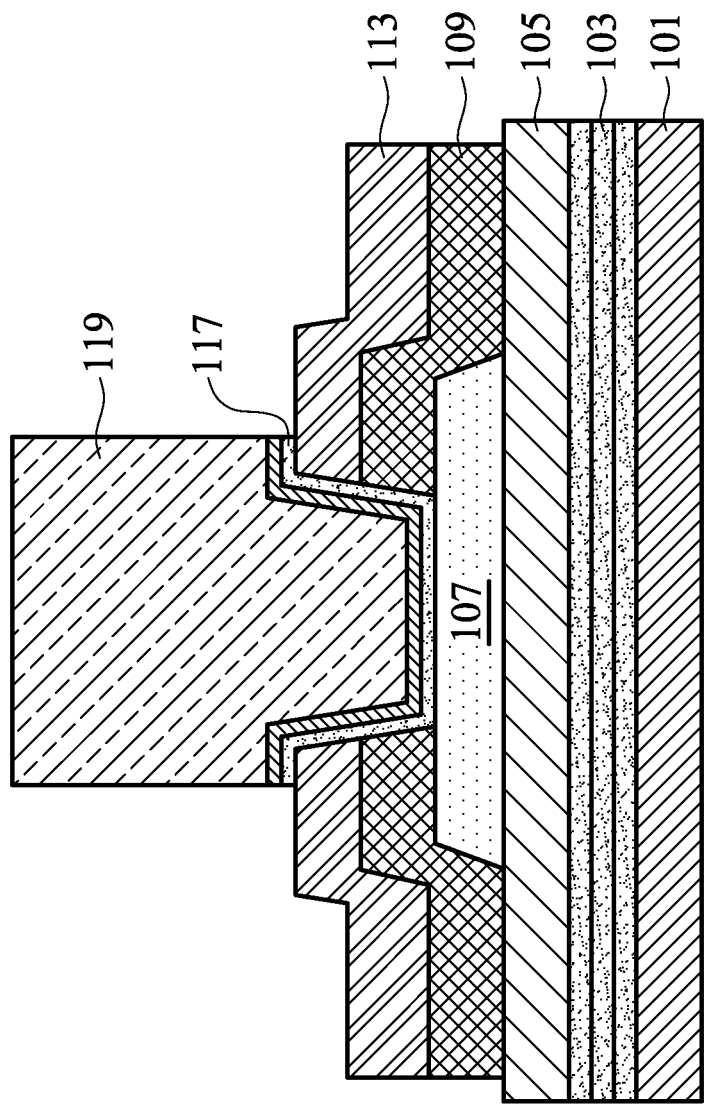
Figure 7:
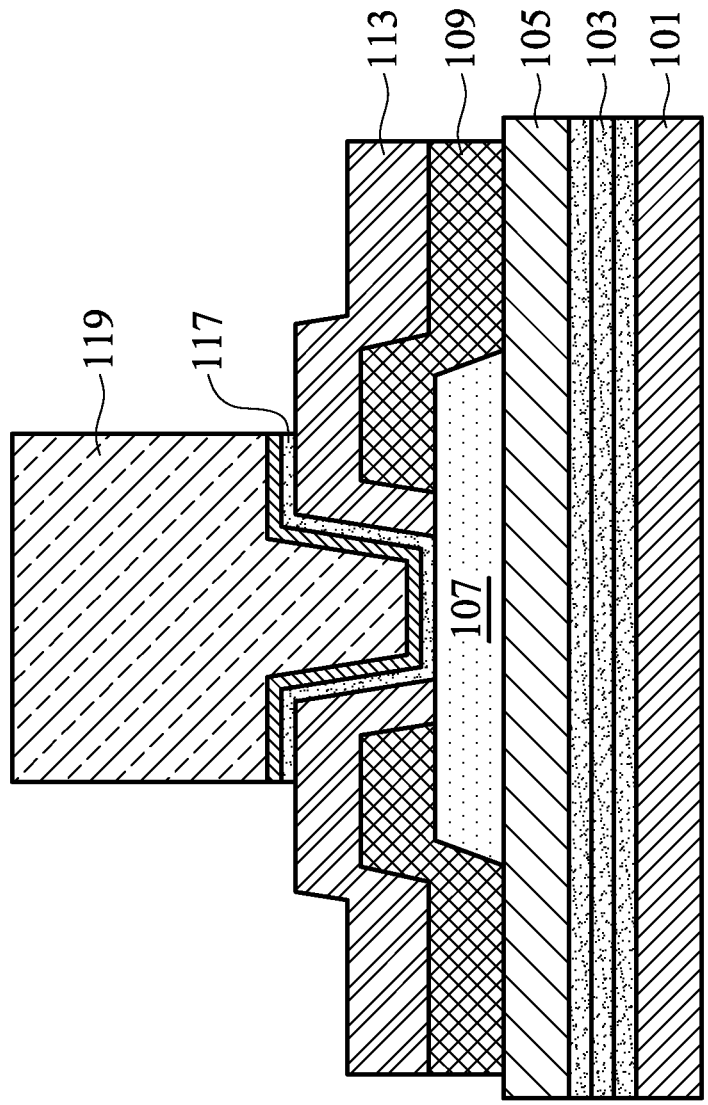
Figure 8:
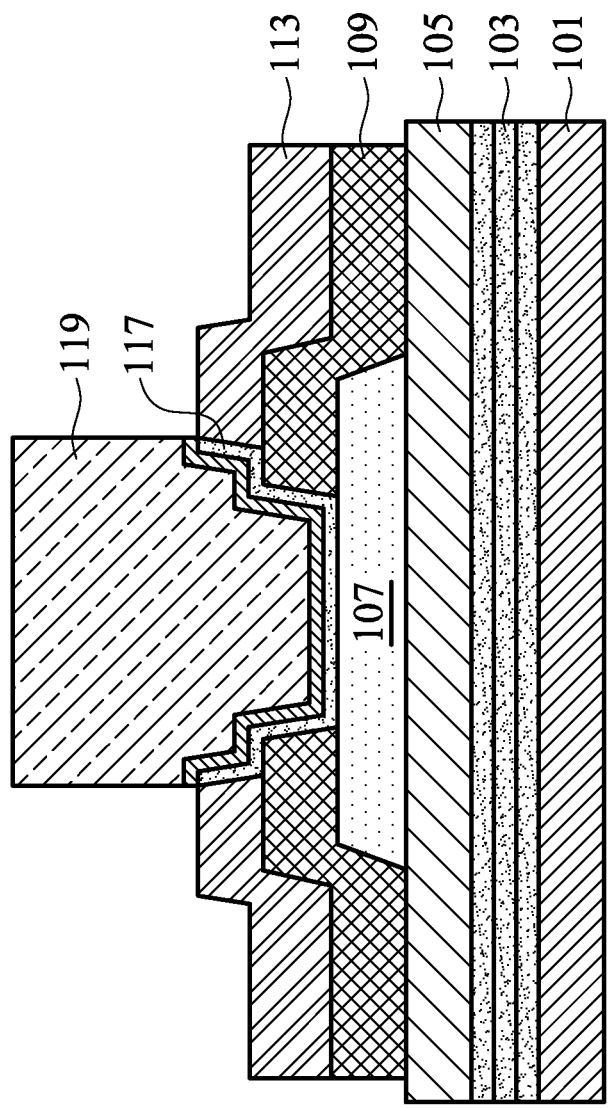

FIGS. 6 to 8 depict various examples of conductive features 119 formed on the UBM layer 117 with different relative sizes of the first width W1 and the second width W2 in accordance with embodiments of the disclosure. FIG. 6 illustrates the second width W2 of polyimide layer 109 is substantially equal to the third width W3 of silicon-based protection layer 113. The combined opening 115 exposes a portion of the bond pad 107. The UBM layer 117 is formed over the combined opening 115, and also overlies a top portion of the silicon-based protection layer 113 and contacts the exposed portion of the bond pad 107. The conductive feature 119 is overlying the UBM layer 117.

FIG. 7 illustrates another embodiment of this disclosure. In this embodiment, the second width W2 of polyimide layer 109 is larger than the third width W3 of silicon-based protection layer 113. In this embodiment the sidewalls 114 of the combined opening 115 are formed entirely by portions of the silicon-based protection layer 113 because the silicon-based protection layer 113 covers the polyimide layer 109 within the combined opening 115. The bond pad 107 is exposed through the combined opening 115. In this embodiment, the UBM layer 117 also overlies a top portion of the silicon-based protection layer 113 and contacts the exposed portion of the bond pad 107 through the combined opening 115. The conductive feature 119 overlies the UBM layer 117.

FIG. 8 illustrates another embodiment of this disclosure. In this embodiment, the second width W2 of polyimide layer 109 is smaller than the third width W3 of silicon-based protection layer 113. Consequently, a top portion 118 of polyimide layer 109 is exposed through the combined opening 115. The UBM layer 117 overlies a top portion of the polyimide layer 109 and lines the sidewalls 114 of the combined opening 115. The UBM layer 117 does not overlie the top portion of the silicon-based protection layer 113. The conductive feature 119 overlies the UBM layer 117.

Various embodiments of the present invention may be used to moderate the shortcomings of the conventional solder bump manufacturing process. For example, in the various embodiments the silicon-based protection layer 113 protects the polyimide layer 109 from damage in the following plasma clean process. A proper range of the W2/W1 and W3/W1 will improve the acceptable yield of assembly.

Although exemplary embodiments and the respective advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A semiconductor die, comprising:
   a substrate;
   a bond pad over the substrate, the bond pad having a first width;
   a polyimide layer over the substrate and the bond pad, the polyimide layer having a first opening over the bond pad with a second width;
   a silicon-based protection layer overlying the polyimide layer, the silicon-based protection layer having a second opening over the bond pad with a third width, wherein the first opening and the second opening form a combined opening having sidewalls to expose a portion of the bond pad;
   an under bump metallurgy (UBM) layer over the sidewalls of the combined opening and contacting the exposed portion of the bond pad; and
   a conductive feature overlying the UBM layer;

wherein a ratio of the third width to the first width is between about 0.15 to about 0.6, and the second width is smaller than the third width.

2. The semiconductor die of claim 1, wherein the UBM layer covers an entire height of the sidewalls of the combined opening and also overlies a top portion of the silicon-based protection layer outside the combined opening.

3. The semiconductor die of claim 1, wherein a ratio of the second width to the first width is between about 0.15 to about 0.6.

4. The semiconductor die of claim 1, wherein the conductive feature comprises a solder bump or a copper pillar.

5. The semiconductor die of claim 1, wherein the silicon-based protection layer comprises silicon nitride, silicon oxynitride, silicon oxide, or silicon carbide.

6. The semiconductor die of claim 1, further comprising a low-k dielectric layer over the substrate and underlying the bond pad.

7. The semiconductor die of claim 1, wherein the UBM layer covers an entire height of the sidewalls of the combined opening, but does not overlie a top portion of the silicon-based protection layer outside the combined opening.

8. The semiconductor die of claim 1, wherein the UMB layer separates the conductive feature from the silicon-based protection layer.

9. A semiconductor die, comprising:
a substrate;
a low-k dielectric layer over the substrate;
a bond pad over the low-k dielectric layer, the bond pad having a first width;
a polyimide layer over the bond pad and the substrate, the polyimide layer having a first opening with a second width;
a silicon nitride layer directly over the polyimide layer, the silicon nitride layer having a second opening with a third width, wherein the first opening and the second opening form a combined opening having sidewalls to expose the portion of the bond pad, and the second width is smaller than the third width;
an under bump metallurgy (UBM) layer that lines the sidewalls of the combined opening, overlies a top portion of the silicon nitride layer outside the combined opening, and contacts the exposed portion of the bond pad; and
a conductive feature overlying the UBM layer;
wherein the sidewalls of the combined opening have a stepwise profile above the exposed portion of the bond pad.

10. The semiconductor die of claim 9, wherein the bond pad comprises aluminum, aluminum alloy, copper, copper alloy, or combinations thereof.

11. The semiconductor die of claim 9, wherein a ratio of the second width to the first width is between about 0.15 to about 0.6.

12. The semiconductor die of claim 11, wherein a ratio of the third width to the first width is between about 0.15 to about 0.6.

13. The semiconductor die of claim 9, wherein the conductive feature comprises a solder bump or a copper pillar.

14. A method of forming a conductive feature, said method comprising:
forming a bond pad over a substrate, the bond pad having a first width;
forming a polyimide layer over the substrate and the bond pad, the polyimide layer having a first opening over the bond pad with a second width;
forming a silicon-based protection layer over the polyimide layer, the silicon-based protection layer having a second opening over the bond pad with a third width, wherein the first opening and the second opening form a combined opening having sidewalls to expose a portion of the bond pad, wherein the combined opening has a stepwise profile above the exposed portion of the bonding pad;
forming an under bump metallurgy (UBM) layer over the sidewalls of the combined opening and in contact with the exposed portion of the bond pad; and
forming a conductive feature over the UBM layer, wherein the UBM layer separates the conductive feature from the silicon-based protection layer.

15. The method of claim 14, wherein the silicon-based protection layer comprises silicon nitride, silicon oxynitride, silicon oxide, or silicon carbide.

16. The method of claim 14, wherein a ratio of the second width to the first width is between about 0.15 to about 0.6.

17. The method of claim 16, wherein a ratio of the third width to the first width is between about 0.15 to about 0.6.

18. The method of claim 14, wherein the conductive feature comprises a solder bump or a copper pillar.

19. The method of claim 14, wherein forming the silicon-based protection layer comprises forming the third width to be larger than the second width.

20. The method of claim 14, wherein forming the UBM layer comprises forming the UBM layer over a top surface of the silicon-based protection layer.

* * * * *